United States Patent [19]

Suzuki et al.

[11] Patent Number: 5,043,314

[45] Date of Patent: Aug. 27, 1991

[54] RECORDING MEDIUM

[75] Inventors: Koji Suzuki, Kasugai; Jun Sakai; Shunichi Higashiyama, both of Nagoya; Keiko Suzuki, Okazaki; Mikio Imaeda, Bisai, all of Japan

[73] Assignee: Brother Kogyo Kabushiki Kaisha, Aichi, Japan

[21] Appl. No.: 550,225

[22] Filed: Jul. 10, 1990

Related U.S. Application Data

[63] Continuation of Ser. No. 284,096, Apr. 20, 1988, abandoned.

[30] Foreign Application Priority Data

| Apr. 30, 1987 | [JP] | Japan | 62-107026 |
| Jun. 8, 1987 | [JP] | Japan | 62-142557 |
| Jul. 31, 1987 | [JP] | Japan | 62-193381 |
| Aug. 6, 1987 | [JP] | Japan | 62-196670 |
| Aug. 26, 1987 | [JP] | Japan | 62-212328 |
| Sep. 11, 1987 | [JP] | Japan | 62-228846 |

[51] Int. Cl.$^5$ .................. B41M 5/165; G03C 1/00; G03C 1/72
[52] U.S. Cl. .................. 503/214; 427/152; 430/138; 503/215; 503/226
[58] Field of Search .................. 427/150–152; 428/913; 503/200, 214, 226, 215; 430/138

[56] References Cited

U.S. PATENT DOCUMENTS

| 4,501,809 | 2/1985 | Hiraishi et al. | 430/138 |
| 4,701,397 | 10/1987 | Rourke et al. | 430/138 |
| 4,751,165 | 6/1988 | Rourke et al. | 430/138 |

FOREIGN PATENT DOCUMENTS

| 0045191 | 3/1984 | Japan | 503/226 |
| 1199992 | 9/1986 | Japan | 503/226 |
| 2130891 | 6/1987 | Japan | 503/226 |
| 1068882 | 5/1967 | United Kingdom | 430/200 |
| 1151772 | 5/1969 | United Kingdom | 428/916 |
| 2187298 | 9/1987 | United Kingdom | 430/138 |

*Primary Examiner*—Bruce H. Hess
*Attorney, Agent, or Firm*—Oliff & Berridge

[57] ABSTRACT

A recording medium which enables formation of an image on any desired substrate is disclosed, which comprises a support having provided thereon at least a color developer capable of color-forming reaction with a dye precursor, and an adhesive such as heat-sensitive adhesives, tackifying composition, etc.

30 Claims, 7 Drawing Sheets

RECORDING MEDIUM

This is a Continuation of application Ser. No. 07/184,096 filed Apr. 20, 1988, now abandoned.

FIELD OF THE INVENTION

This invention relates to a recording medium having a layer of color developer capable of color development by the reaction with a dye precursor encapsulated in microcapsules upon press development.

BACKGROUND OF THE INVENTION

Light-sensitive pressure-sensitive recording media have been known, such as a self-contained type recording medium comprising a support having on the same surface thereof microcapsules encapsulating a photocurable resin, a photopolymerization initiator and a dye precursor as main components, and a substance capable of color development (a so-called "color developer") by reacting with the dye precursor; and a separate-sheet type recording medium composed of a light-sensitive sheet coated with such photocurable microcapsules and another sheet coated with a color developer (color developer sheet), as described, for example, in Japanese Patent Application (OPI) Nos. 23025/83, 88739/83 and 88740/83. The term "OPI" means unexamined, published application.

These recording media utilize the property of microcapsules that they become cured upon light-exposure due to the photocurable resin, etc. encapsulated, and such a recording medium is mounted on a device which effects the steps involving exposing the microcapsules to light in conformity with image information and rupturing unexposed and uncured microcapsules to bring the dye precursor encapsulated therein in contact with the color developer which is provided on the same surface of the recording medium or coated on another sheet, whereby a color-forming reaction occurs between the dye precursor and the color developer to form an image.

However, a recording can only be effected on the specifically processed sheets, i.e., the light-sensitive pressure-sensitive sheet or the color developer sheet but not on ordinary paper or other substrates such as cloth, PET film, etc.

SUMMARY OF THE INVENTION

An object of this invention is to provide a recording medium capable of forming an image on any desired substrate.

The above object has been achieved by a recording medium comprising a support having provided thereon at least an adhesive and a color developer capable of color-forming reaction with a dye precursor.

DETAILED DESCRIPTION OF THE INVENTION

The color developer which can be used in this invention is not particularly limited, and any color developer used in conventional light-sensitive pressure-sensitive media as described, for example, in Japanese Patent Application (OPI) No. 17432/83 can be used. Examples of the color developer include inorganic acidic substances such as acid clay, activated clay, kaolin, zeolite and bentonite; phenolic compounds such as p-cresol, p-phenylphenol, p-chlorophenol, 2,2-methylenebis(4-tert-butylphenol) and phenol-formaldehyde condensates; aromatic carboxylic acid compounds such as salicylic acid, gallic acid and p-butylbenzoic acid; metal salts of aromatic carboxylic acid compounds such as zinc salicylate and tin salicylate; and metal compounds such as ferric stearate, magnesium stearate and zinc stearate, which may be used alone or as a mixture thereof.

The adhesives which can be used in the present invention includes heat-sensitive adhesives and pressure-sensitive adhesives (so-called "tackifying composition").

Preferred embodiments of the present invention are explained with reference to the drawings in detail below.

Figure 1:
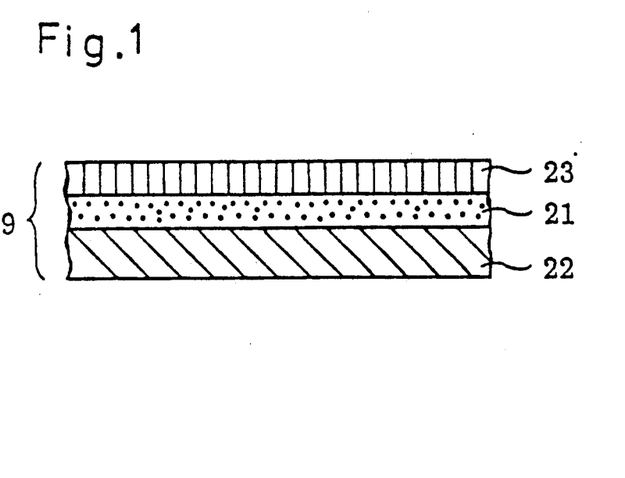
FIG. 1 shows a cross-sectional view of one of the recording medium of this invention having a heat-sensitive adhesive layer (the first embodiment).

FIG. 1 shows a recording medium of the first embodiment comprising support 22 having provided thereon color developer layer 21 and heat-sensitive adhesive layer 23 in sequence. Color developer layer 21 may contain a binder other than the color developer. Support 22 may be paper, polyethylene terephthalate sheet or any other materials as long as they exhibit relatively good peeling property against the color developer or the binder. For heat-sensitive adhesive layer 23 are used thermoplastic substances which are softened or melted when heated and solidified when cooled, such as vinyl resins (e.g., vinyl alcohol-vinyl acetate copolymers, vinyl alkyl ether-maleic anhydride copolymers, polyvinyl chloride, vinyl chloride-vinyl acetate copolymers, etc.), acrylic resins (e.g., polyethylacrylate, polybutylmethacrylate, polymethylcyanoacrylate, etc.), stylene resins, cumarone-indene resins, polyamide resins, waxes, and the like.

Figure 2:
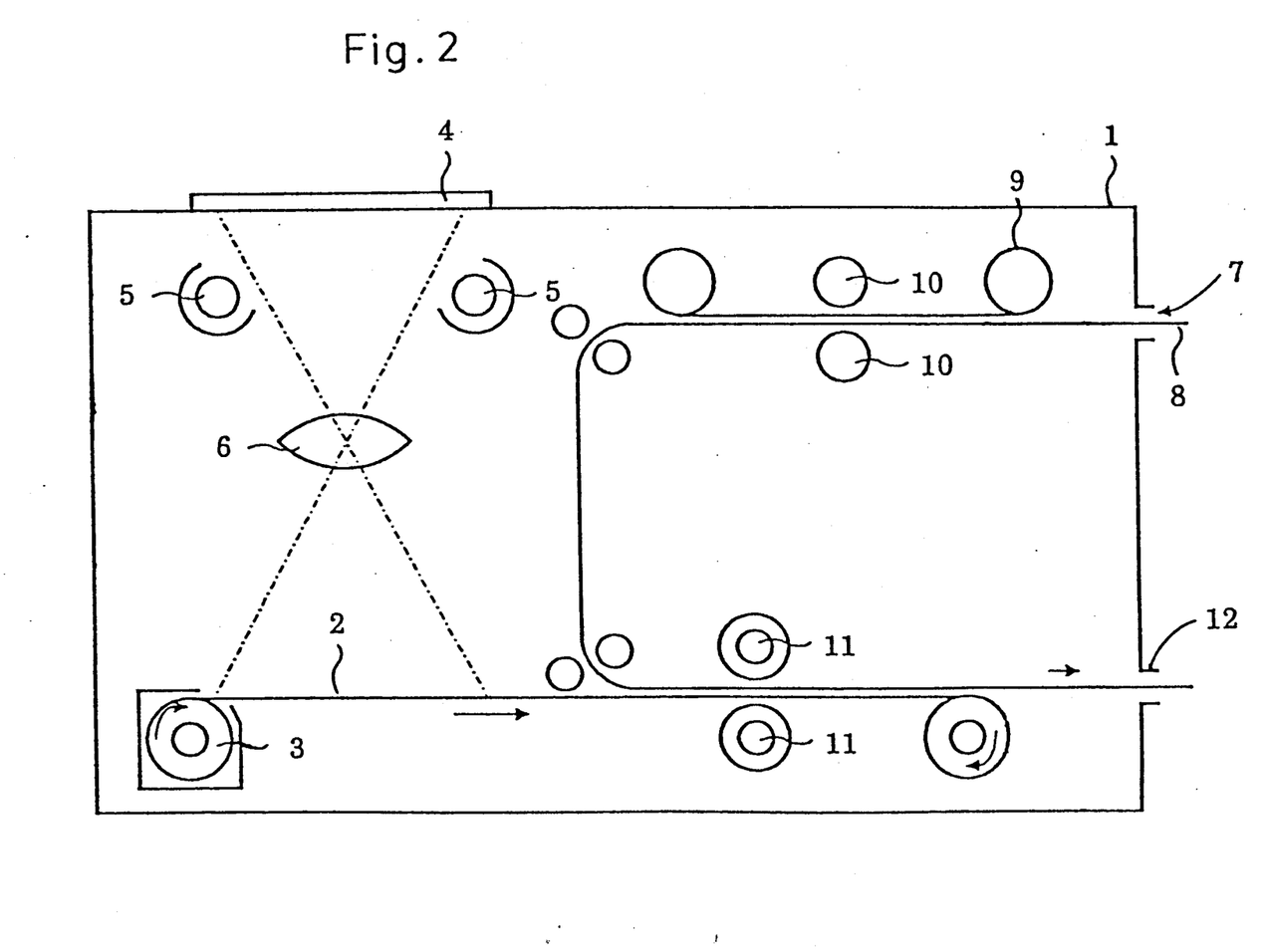
FIG. 2 shows basic constitution of an image recording device for the recording medium of the first embodiment.

FIG. 2 illustrates an image recording device suitable for the recording medium of the first embodiment. Light-sensitive sheet 2 rolled up on sheet-supply roll 3 is mounted in image recording device 1 and the sheet is unrolled and moved in the direction indicated by the arrow. On the way, they are provided light source 5 to irradiate the surface of original 4 and optical lens 6 through which an image is formed on the surface of light-sensitive sheet 2. Further, as a means of transferring a color developer from recording medium 9 having a dual layer structure consisting of a color developer layer and a heat-sensitive adhesive layer in this order to image-receiving substrate 8 made of a desired material (for example, cloth, plastic film, a postal card, and the like) supplied from inlet 7, heat-and-press roll 10 is provided to heat and press image-receiving substrate 8 in contact with the outer layer, the heat-sensitive adhesive layer, of recording medium 9. Press roll 11 is also provided to effect press development in the state that the light-exposed sheet 2 and the color developer-transferred substrate 8 are put together. Image recording device 1 has outlet 12 for the substrate 8.

The image recording device is operated as follows. Original 4 is irradiated with light from light source 5, and the reflected light forms an image on light-sensitive sheet 2 through lens 6. On the other hand, image-receiving substrate 8 is fed from inlet 7 and brought in contact with recording medium 9 having the dual layer structure, followed by heating and pressing with roll 10, whereby the heat-sensitive adhesive layer is melted and the color developer thereunder is transferred with the melted adhesive layer to image-receiving substrate 8. The color developer-adhered image-receiving substrate 8 is put over the light-exposed sheet 2 and subjected to press development with press roll 11. Then, the image-developed substrate 8 is driven to outlet 12.

Figure 3:
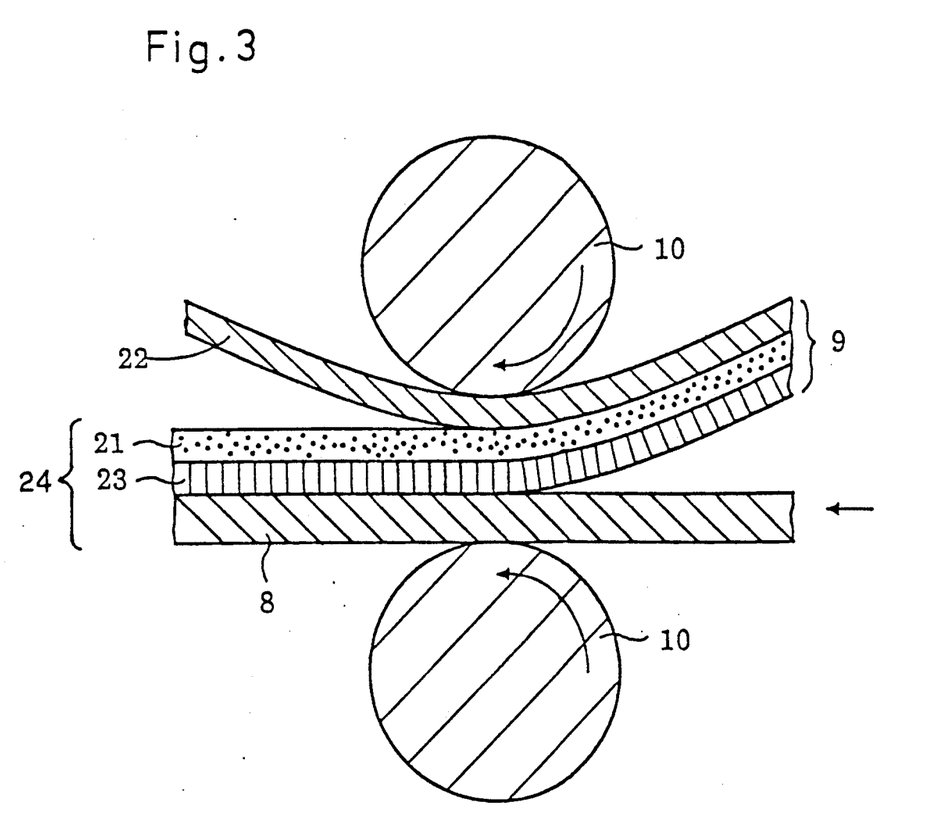
FIG. 3 shows the state where a color developer layer is heat-transferred from the recording medium of the first embodiment to an image-receiving substrate of a desired material.

FIG. 3 shows an enlarged view of the means to transfer color developer layer 21 together with heat-sensitive adhesive layer 23 from recording medium 9 to image-receiving substrate 8 provided from inlet 7.

Using the recording medium having a color developer layer and a heat-sensitive adhesive layer in sequence according to the first embodiment of this invention, an image can be recorded on any desired substrate. Further, since the color developer and the adhesive are provided in separate layers, image-fogging due to embedding of the color developer in the adhesive can be prevented.

Figure 4:
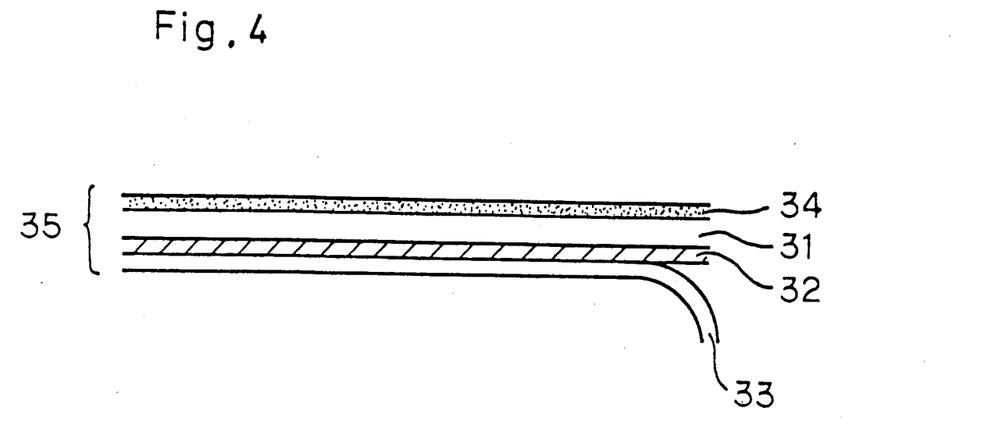
FIG. 4 shows a cross-sectional view of another recording medium of this invention having a pressure-sensitive adhesive layer (the second embodiment).

FIG. 4 shows a recording medium of the second embodiment of this invention, which comprises support 31 having color developer layer 34 on one surface thereof and pressure-sensitive adhesive layer (tackifying layer) 32 on the other surface and which corresponds to a color developer sheet of the aforesaid separate sheet-type light-sensitive pressure-sensitive recording media except that a tackifying layer is further provided on the back surface thereof. In the figure, numeral 33 indicates a separable sheet.

Support 31 which can be used in this embodiment may be plastic films of polyethylene, polyesters, polycarbonates, polyamides, etc., woven cloth of nylon, silk, cotton, etc., paper, or the like.

Tackifying layer 32 is formed by coating a composition composed mainly of an elastic body and a tackifier and further containing a tackiness-control agent. As the elastic body high molecular weight compounds capable of importing cohesive force to the layer are employed, such as natural rubbers, synthetic rubbers, polyvinyl ethers, polyacrylates, and the like. The tackifier is a compound that melts into the elastic body to make it tacky, and examples include polyterpene resins, gum rosin, rosin esters and derivatives thereof, oil-soluble phenol resins, cumarone indene resins, petroleum hydrocarbon resins, and the like. For the purpose of controlling the tackiness of the layer, fluid substances such as plasticizers (e.g., dioctyl phthalate and chlorinated paraffin), fat and oil, carbamic acid esters and high molecular polymers having a low polymerization degree, or fillers such as stebelite, titanium white, calcium carbonate may further be added.

Examples of separable sheet 33 which can be used include non-sticky sheets obtained by coating a silicone resin on a film of polyethylene terephthalate, polyethylene, polypropylene, etc., or on paper; and a film of fluorine-containing resins such as polytetrafluoroethylene.

FIGS. 5 to 9 show another embodiment of the present invention (the third embodiment) which further carries, on recording medium 35 of the second embodiment, light-sensitive microcapsules 46 encapsulating a dye precursor and a photocurable resin, like a light-sensitive pressure-sensitive recording medium of self-contained type.

Various light-sensitive microcapsules are known, for example, those described in Japanese Patent Application (OPI) No. 17432/83, which encapsulate a dye precursor and a photocurable resin, and optionally a photopolymerization initiator and a sensitizer, and any conventional light-sensitive microcapsules can be used in this invention.

The recording media of the third embodiment can be classified into two types: one having tackifying layer 42 on the opposite side of support 41 to the side on which color developer layer 44 is provided; and the other having tackifying layer 42 and color developer layer 44 on the same side of support 41.

Figure 5:
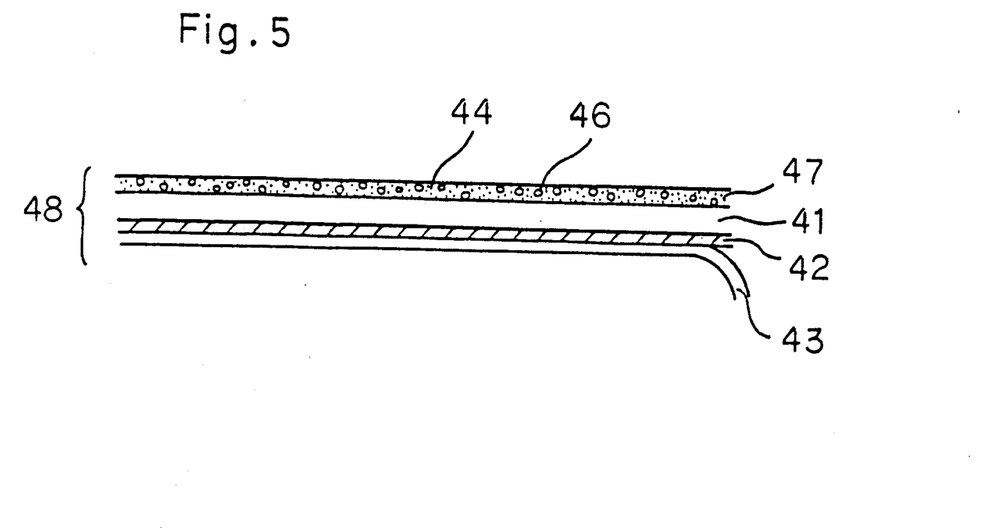
FIGS. 5 to 9 show cross-sectional views of the recording media of this invention having coated thereon a light-sensitive microcapsules encapsulating a dye precursor and a photocurable resin, a color developer, and a pressure-sensitive adhesive (the third embodiment).

FIG. 5 shows a recording medium 48 of the former type, wherein light-sensitive microcapsules 46 are dispersed in color developer layer 44 to form color-forming layer 47. Support 41 may be either opaque or transparent as used in the recording medium of the second embodiment.

FIGS. 6 to 9 show recording media 49 of the latter type comprising support 41 having provided thereon color developer layer 44, tackifying layer 42, and separable sheet 43, which are subjected to light-exposure from the support side. After color development, separable sheet 43 is removed and the resulting image-recorded sticky sheet is adhered to a desired substrate so that the image is observed through support 41. Thus, a transparent support is used as support 41 in this embodiment, that is, the recording medium of this embodiment comprises a sticky sheet composed of a transparent support having coated thereon light-sensitive microcapsules, a color developer and a tackifier in layers and or in the form of dispersion, and a separable sheet provided on the sticky surface of the sheet.

Figure 6:
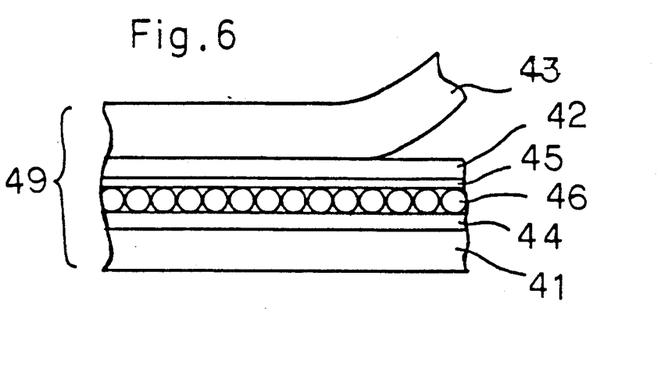
Figure 7:
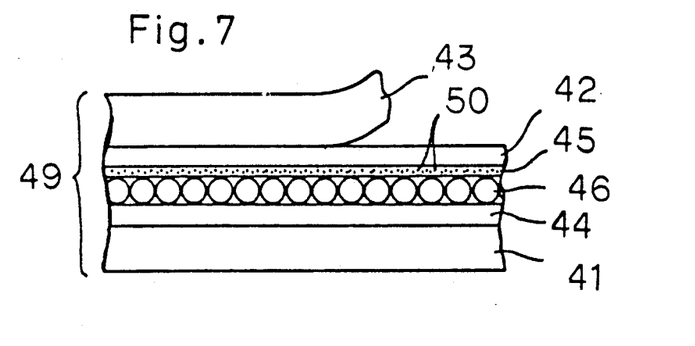
Figure 8:
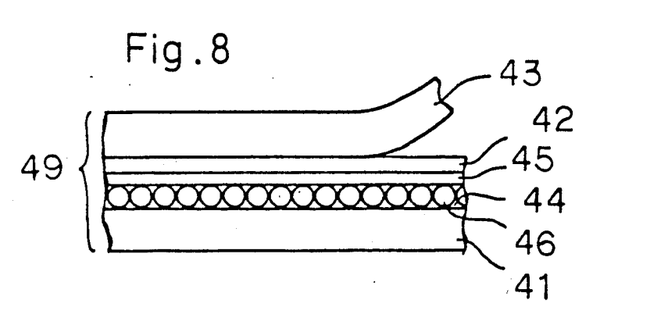
Figure 9:
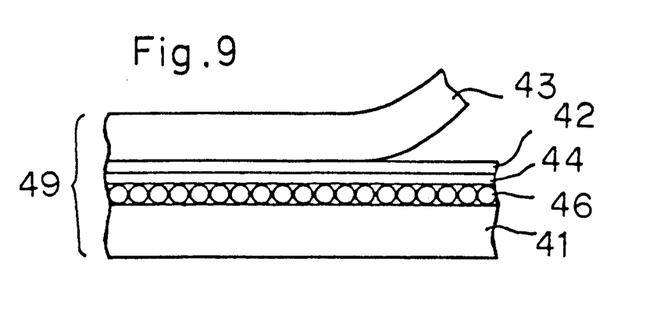

FIG. 6 shows an enlarged cross-sectional view of a recording medium of the latter type, comprising transparent support 41 having provided thereon, in sequence, color developer layer 44, a layer of light-sensitive microcapsules 46, barrier layer 45, tackifying layer 42, and separable sheet 43. Barrier layer 45 may contain pigment 50 as shown in FIG. 7. This modification is preferred in the case where a substrate to be adhered is deeply colored since the image on the recording medium can be observed through transparent support 41 in high contrast. When a fluorescent pigment is used, the recorded image appears to be embossed. Light-sensitive microcapsules 46 need not be coated as an independent layer, and they may be dispersed in color developer layer 44 as shown in FIG. 8. Further, barrier layer 45 may be omitted from the recording medium as shown in FIG. 9.

As transparent support 41 used in this embodiment, films of polyethylene, polypropylene, polystyrene, polyvinyl chloride, polymethylmethacrylate, polyethylene terephthalate, polycarbonate, nylon, polymethylpentene or the like may be used.

Barrier layer 45 is provided to prevent adverse influence (e.g., insufficient color formation) of components of tackifying layer 42 on components of color developer layer 44 and the layer of light-sensitive microcapsules 46. Films of polyvinyl alcohol, polyvinyl butyral or the like are preferably used for the purpose. Barrier layer 45 may also be formed by vacuum deposition of aluminium, gold, etc.

The recording media of the second and third embodiments of this invention can be easily adhered on a desired substrate merely by removing the separable sheet after conventional color development, and thus the application of a light-sensitive pressure-sensitive recording medium can be markedly expanded according to this embodiment.

As another embodiment, an adhesive, for example, heat-sensitive adhesive may also be used in place of a tackifying composition in the third embodiment described above. Namely, the fourth embodiment is a recording medium comprising a support having coated thereon light-sensitive microcapsules, a color developer and an adhesive in layers and/or in the form of dispersion, as shown in FIGS. 10 to 17. According to this embodiment, recording medium 51 is put on a desired substrate after color development and adhered thereto with the adhesive provided on the recording medium. While the recording image is generally viewed through support 52 as in the case of the third embodiment, support 52 is not necessarily transparent when the substrate to be adhered is transparent through which the recording image can be viewed.

Figure 10:
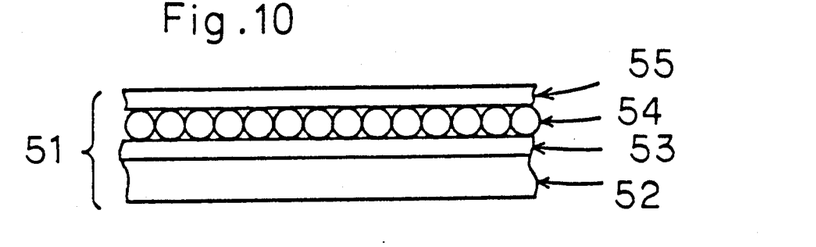
FIGS. 10 to 13 show cross-sectional views of the recording media of this invention having coated thereon a light-sensitive microcapsules encapsulating a dye precursor and a photocurable resin, a color developer, and a heat-sensitive adhesive (the fourth embodiment).
Figure 11:
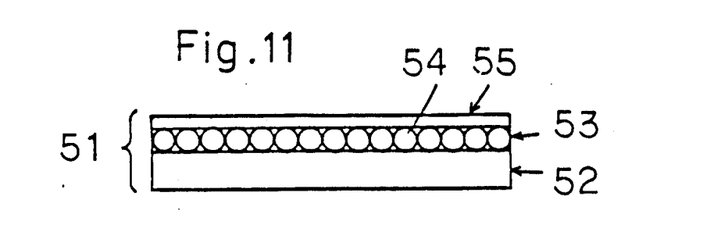
Figure 12:
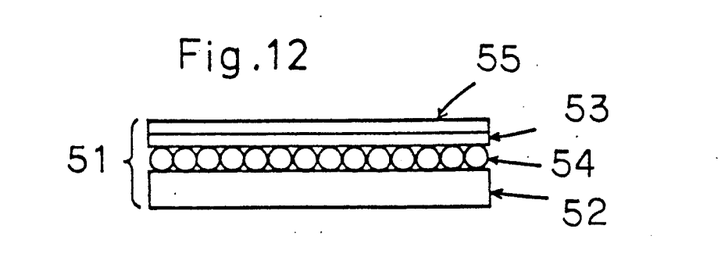
Figure 13:
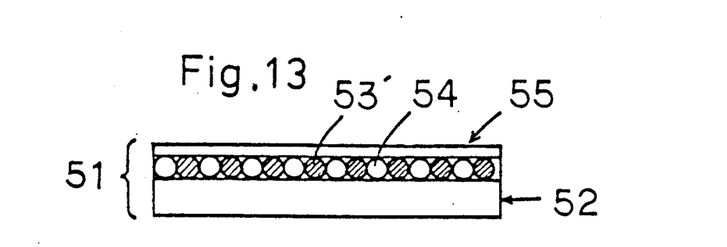

FIG. 10 shows an enlarged cross-sectional view of recording medium 51 of the fourth embodiment, wherein transparent support 52 is coated with color developer layer 53, a layer of light-sensitive microcapsules 54 and then adhesive layer 55. The recording medium may also be modified in various manners: for example, (i) microcapsules 54 is dispersed in color developer layer 53 instead of forming a layer alone, as shown in FIG. 11; (ii) transparent support 52 is coated with a layer of light-sensitive microcapsules 54, color developer layer 53 and adhesive layer in this order as shown in FIG. 12; and (iii) light-sensitive microcapsules 54 and microcapsules 53' encapsulating a color developer are dispersed and coated as a single layer on transparent support 52 and then adhesive layer 55 is provided as shown in FIG. 13.

For the transparent support and the light-sensitive microcapsules, the aforesaid materials in the third embodiment can be used, respectively. The adhesive used in this embodiment includes heat-sensitive adhesives as employed in the first embodiment.

Figure 14:
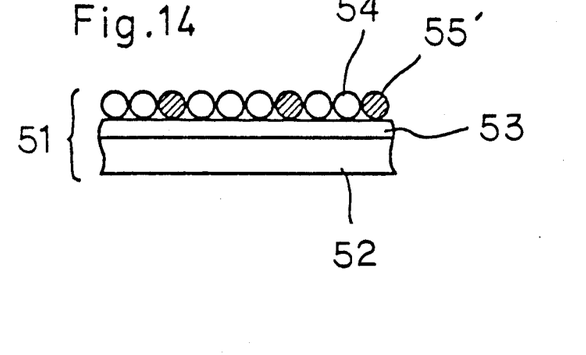
FIGS. 14 to 17 show cross-sectional views of other recording media of the fourth embodiment wherein the adhesive is encapsulated in microcapsules.

Further, the adhesive may be encapsulated and provided in the form of microcapsules. Namely, another example of the fourth embodiment is a recording medium comprising a support having coated thereon light-sensitive microcapsules, a color developer and microcapsules encapsulating an adhesive, in layers and/or in the form of dispersion. FIG. 14 shows an enlarged cross-sectional view of such a recording medium. In more detail, recording medium 51 have transparent support 52 coated on the surface thereof color developer layer 53 and further thereon a dispersion composed of light-sensitive microcapsules 54 and microcapsules 55' encapsulating an adhesive (hereafter referred to as "adhesive microcapsules").

Figure 18:
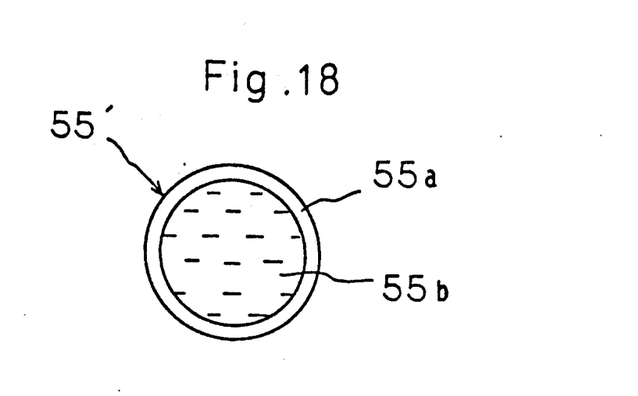
FIG. 18 shows an enlarged cross-sectional view of the microcapsules encapsulating the adhesive which are used in the recording medium of the fourth embodiment.

Adhesive microcapsules 55' is composed of shell 55a and inner liquid component 55b as shown in FIG. 18. The liquid component 55b comprises an adhesive and a solvent thereof (hereafter collectively referred to as "adhesive composition"). Examples of the adhesive composition includes natural adhesive compositions containing as main components casein, starch, etc., thermoplastic resin-based adhesive composition having a thermoplastic resin (e.g., vinyl chloride-vinyl acetate copolymer, polyvinyl alcohol, acrylic resins, etc.) dissolved in an appropriate solvent (e.g., methyl ethyl ketone, acetone, tetrahydrofuran, cyclohexanone, etc.), and elastomer-based adhesive compositions dissolving an elastomer (e.g., natural rubbers, reclaimed rubbers, butadiene-styrene copolymer, neoprene, chloroprene, etc.). The shell material of pressure- or heat-rupturable microcapsule encapsulating the above adhesive composition may be gelatin, casein, gum arabi, polyethylene, polystyrene; or other materials used for shell of light-sensitive microcapsules 54.

Figure 15:
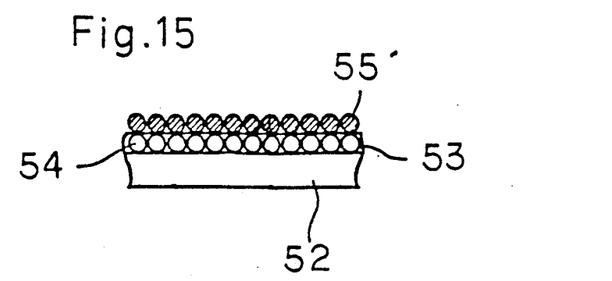
Figure 16:
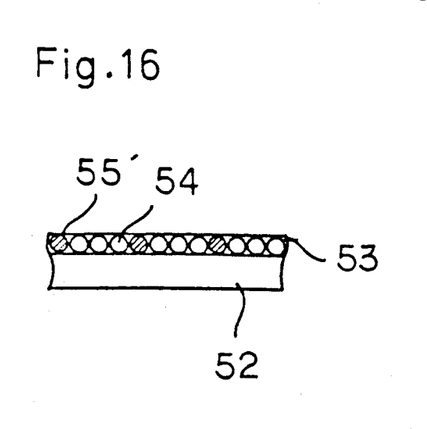
Figure 17:
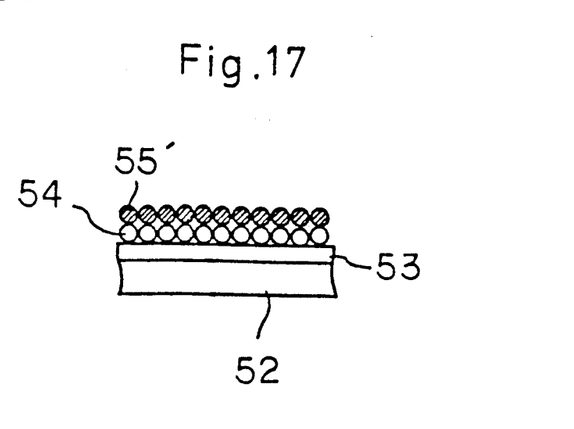

FIGS. 15, 16 and 17 illustrate other recording medium using the adhesive microcapsules. FIG. 15 shows a layer structure, wherein light-sensitive microcapsules 54 are dispersed in color developer layer 53 which is coated with adhesive microcapsules 55'. FIG. 16 shows another layer structure, wherein both light-sensitive microcapsules 54 and adhesive microcapsules 55' are dispersed in color developer layer 53. FIG. 17 shows still another layer structure, wherein transparent support 52 is subsequently coated with a color developer layer 53, a layer of light-sensitive microcapsules 54 and a layer of adhesive microcapsules 55'.

Figure 19:
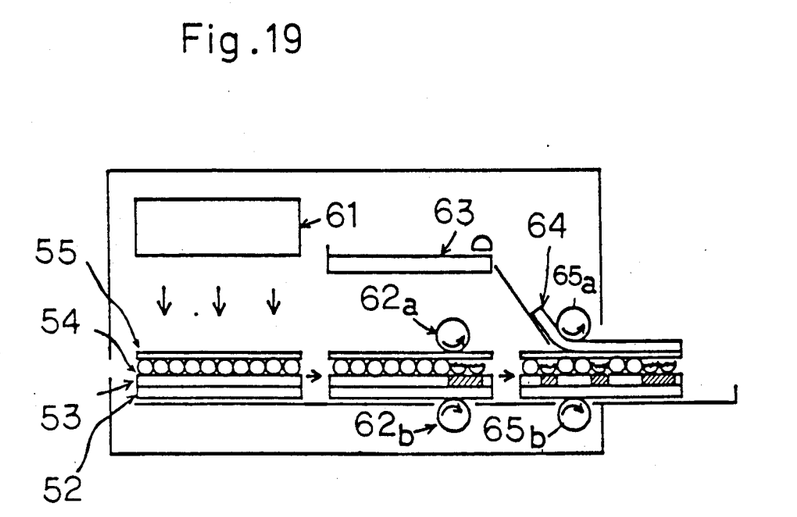
FIGS. 19 and 20 show basic constitution of image recording devices for the two kinds of the recording media shown in FIGS. 10 to 13 and FIGS. 14 to 17, respectively.

The recording medium having an adhesive layer as shown in FIGS. 10 to 13 are suitably used in a recording device as shown in FIG. 19. In the figure, a latent image is formed in recording medium 51 comprising transparent support 52 having coated thereon, in sequence, color developer layer 53, a layer of light-sensitive microcapsules 54 and an adhesive layer 55 by operating light-exposure system 61 utilizing light flux from light source (not shown). The exposed recording medium 51 is passed through a pair of press rolls 62a and 62b, whereby light-sensitive microcapsules 54 are selectively ruptured to release a dye precursor contained therein which undergoes a color forming reaction with a color developer in layer 53. The adhesive layer of the thus developed recording medium is then brought in contact with an ordinary paper 64 for recording supplied from cassette 63, and they are passed through a pair of heat rolls 65a and 65b, whereby adhesive layer 55 becomes soft and sticky so that the image developed medium 51 is adhered to paper 64. If press rolls 62a and 62b are equipped with heating means, heat rolls 65a and 65b may be omitted. The developed image on recording medium 51 adhered to paper 64 is viewed through transparent support 52.

Figure 20:
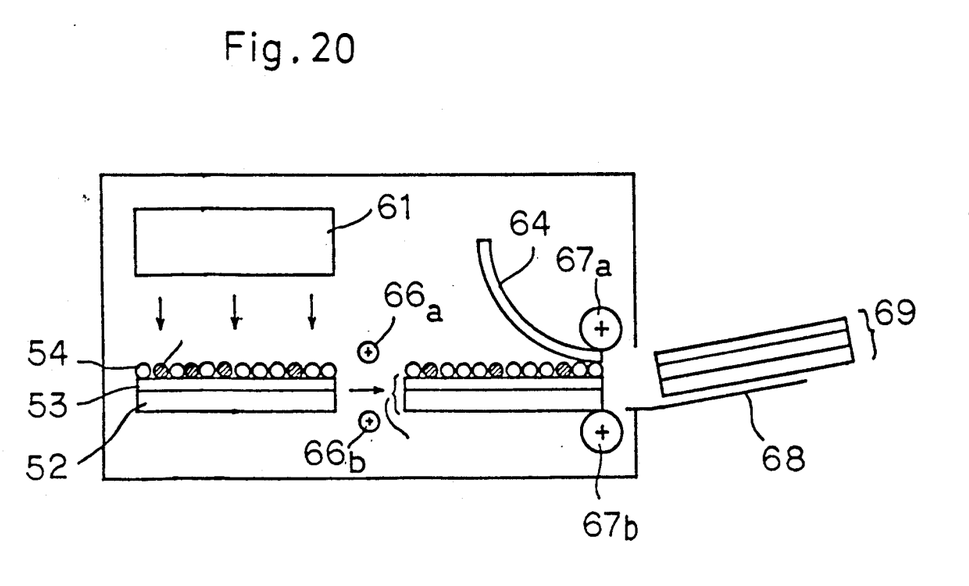

The recording medium using adhesive microcapsules as shown in FIGS. 14 to 17 are subjected to the same proceedings as in FIG. 19, except that the development and the adhesion of ordinary paper 64 are effected at the same time using press rolls 67a and 67b as shown in FIG. 20. That is, by the application of pressure, adhesive microcapsules are uniformly ruptured to render recording medium 51 sticky on which paper 64 is provided, while light-sensitive microcapsules are selectively ruptured to effect color development by the reaction of the released dye precursor and the color developer. Thus, an image-recorded sheet 69 can be easily obtained. In FIG. 20, numerals 66a and 66b indicate feed rolls and numeral 68 indicates a tray.

In the aforesaid devices as shown in FIGS. 19 and 20, light-exposure may be effected through transparent support 52. Further, the ordinary paper for recording may be replaced with a film. In particularly, when it is a transparent film, support 52 is not necessarily transparent.

According to this embodiment, recording can be effected using various kinds of substrates such as postal card, various printed forms, etc. without any pretreatments. Further, the image recorded is protected and given luster by the transparent support.

The recording medium of the first, second and third embodiments of this invention are explained with reference to the following Examples. In the Examples, all parts and percent are by weight unless otherwise indicated.

EXAMPLE 1 (THE FIRST EMBODIMENT)

Fifty parts of acid clay, 30 parts of bisphenol A and 30 parts of p-phenylphenol (color developers) were dispersed in 60 parts of an aqueous solution of polyvinyl alcohol (binder), and the dispersion was coated on a polyethylene terephthalate film (support) using a bar coater #20 and dried. On the thus formed color developer layer 21 as shown in FIG. 1 was further coated a mixture of 10 parts of ethylene-vinyl acetate copolymer, 5 parts of paraffin wax, 0.1 part of a viscosity-controlling agent and 0.1 part of a filler to form a heat-sensitive adhesive layer 23.

The thus prepared recording medium 9 was put on an image-receiving substrate 8 such that the adhesive layer 23 was faced the substrate 8 as shown in FIGS. 2 and 3, and they were passed through a pair of rolls 10 (roll temperature: about 100° C.). The relationship in adhesive strength between the support 22/the color developer layer 21/the heat-sensitive adhesive layer 23/the image-receiving substrate 8 was (support 22/color developer layer 21) < (color developer layer 21/adhesive layer 23) < (adhesive layer 23/substrate 8), so that the heat-sensitive adhesive layer 23 and the color developer layer 21 were transferred onto the image-receiving substrate 8 to obtain an image-forming medium 24.

Then, the image-forming medium 24 carrying the color developer layer 21 as an outer layer was brought in contact with an image-wise exposed light-sensitive sheet 2, and they were subjected to press development with a pair of press rolls 11, whereby an image was recorded in the color developer layer 21 of the image-forming medium 24. The image was not inferior in image qualities to an image recorded in a conventional light-sensitive pressure-sensitive recording medium or color developer sheet. Further, since the recording medium 9 had the dual layer structure, the color developer did not get into the adhesive after development, so that image-fogging did not occur.

EXAMPLE 2 (THE SECOND EMBODIMENT)

A tackifying composition consisting of 50 parts of natural rubber (Mooney viscosity 41), 50 parts of SBR 1502 and 60 parts of rosin ester was dissolved in toluene such that a solid content becomes 20%. The thus prepared coating composition was coated on a 25 μm-thick polyester film 31 and dried at 110° C. for 3 minutes to form a 25 μm-thick tackifying layer 32 as shown in FIG. 4. Then, a silicone-coated separable sheet 33 was provided on the surface of the tackifying layer 32.

On the other hand, a color developer composition consisting of 50 parts of p-phenylphenol, 50 parts of phenol novolak and 10 parts of polyvinyl alcohol was dispersed in water to form a dispersion having a solid content of 50%, which was then coated on the surface of the polyester film 31 opposite to the tackifying layer 32 and dried at 100° C. for 1 minute to form a 25 μm-thick color developer layer 34.

The thus prepared recording medium 35 was put on an image-wise light-exposed light-sensitive sheet carrying photocurable microcapsules in which a dye precursor is encapsulated, such that the color developer layer 34 was brought in contact with the layer of the microcapsules, followed by press development with a pair of press rolls, whereby an image was recorded in the color developer layer 34 due to the color forming reaction of the dye precursor and the color developer. The image-recorded medium 35 could be adhered to a desired substance merely by peeling apart the separable sheet 33.

EXAMPLE 3 (the third embodiment)

Ninety seven parts of butyl acrylate, 3 parts of acrylic acid and 0.2 part of benzoyl peroxide were gradually added to ethyl acetate over 4 hours to thereby a copolymer composition containing a solid content of 50%. To the composition were added 0.8 part of a hardening agent and then 34 parts of rosin ester, whereby a tackifying composition was prepared. The tackifying composition was coated on a 25 μm-thick polyester film 41 and dried to form a 25 μm-thick tackifying layer 42 which was then covered with a silicone-coated separable sheet as shown in FIG. 5.

On the surface of the polyester film 41 opposite to the tackifying layer 42 was coated a dispersion containing 100 parts of light-sensitive microcapsules, 50 parts of p-phenyl phenol, 50 parts of phenol novolak and 15 parts of polyvinyl alcohol in water, followed by drying at 100° C. for 1 minute to form a 50 μm-thick color-forming layer 47. The light-sensitive microcapsules were prepared by a coacervation method, which were composed of a toluene solution containing a dye precursor and a photocurable resin as a core material and gelatin as a shell material.

The thus prepared recording medium 48 of self-contained type was image-wise exposed to light, subjected to press development, whereby an image was recorded in the color-forming layer 47. The image-recorded medium 48 could be adhered onto a desired substance merely by peeling apart the separable sheet 43.

What is claimed is:

1. A photosensitive, pressure-sensitive recording medium for forming a visible image using developer material and microcapsules encapsulating a dye precursor color-reactable with the developer material, comprising:
- a support;
- an image-forming layer provided on the support on which a visible image is formed; and
- a separate image-forming layer receiving substrate for receiving and supporting the image-forming layer thereon, the image-forming layer including the developer material capable of color-forming reaction with the dye precursor encapsulated in the microcapsules, and an adhesive in the form of a separate adhesive layer for transferring and securing the image-forming layer to the separate image-forming layer receiving substrate irrespective of formation of the visible image on the image-forming layer.

2. A recording medium as claimed in claim 1, wherein said adhesive is a heat-sensitive adhesive.

3. A recording medium as claimed in claim 2, wherein said support has a layer of said color developer and a heat-sensitive adhesive.

4. A recording medium as claimed in claim 3, wherein said heat-sensitive adhesive is a thermoplastic substance selected from the group consisting of vinyl resins, acrylic resins, styrene resins, cumarone-indene resins, polyamide resins and waxes.

5. A recording medium as claimed in claim 1, wherein said adhesive is a pressure-sensitive adhesive.

6. A recording medium as claimed in claim 5, wherein said support has a layer of said color developer on one surface thereof, said layer of a pressure-sensitive adhesive and a separable sheet, in sequence, on the opposite surface of the support.

7. A recording medium as claimed in claim 6, wherein said pressure-sensitive adhesive is a composition comprising an elastic body and a tackifier.

8. A recording medium as claimed in claim 7, wherein said elastic body is selected from the group consisting of natural rubbers, synthetic rubbers, polyvinyl ethers and polyacrylates, and said tackifier is selected from the group consisting of polyterpene resins, gum rosin, rosin esters, oil-soluble phenol resins, cumarone-indene resins and petroleum hydrocarbon resins.

9. A recording medium as claimed in claim 6, wherein said layer of color developer contains light-sensitive microcapsules encapsulating at least a dye precursor and a photosensitive resin.

10. A recording medium as claimed in claim 5, which comprises (i) a sticky sheet having a sticky surface and composed of said support having coated thereon (a) light-sensitive microcapsules encapsulating at least a dye precursor and a photosensitive resin, (b) color developer capable of color-forming reaction with said dye precursor and (c) said pressure-sensitive adhesive, and (ii) a separable sheet provided on the sticky surface of the sticky sheet.

11. A recording medium as claimed in claim 10, which comprises the support having coated on one surface thereof the light-sensitive microcapsules and the color developer in layers or in the form of dispersion, and further coated on the opposite surface of the support, in sequence, the layer of the pressure-sensitive adhesive and the separable sheet.

12. A recording medium as claimed in claim 11, wherein said pressure-sensitive adhesive is a composition comprising an elastic body and a tackifier.

13. A recording medium as claimed in claim 12, wherein said elastic body is selected from the group consisting of natural rubbers, synthetic rubbers, polyvinyl ethers and polyacrylates, and said tackifier is selected from the group consisting of polyterpene resins, gum rosin, rosin esters, oil-soluble phenol resins, cumarone-indene resins and petroleum hydrocarbon resins.

14. A recording medium as claimed in claim 1, which comprises said support having provided thereon light-sensitive microcapsules encapsulating at least a dye precursor and a photosensitive resin, a color developer capable of color-forming reaction with said dye precursor and said adhesive dispersion.

15. A recording medium as claimed in claim 14, wherein said adhesive is a heat-sensitive adhesive and is provided as an outer layer.

16. A recording medium as claimed in claim 15, wherein said heat-sensitive adhesive is a thermoplastic substance selected from the group consisting of vinyl resins, acrylic resins, styrene resins, cumarone-indene resins, polyamide resins and waxes.

17. A recording medium as claimed in claim 1, wherein said color developer is selected from the group consisting of inorganic acidic substance, phenolic compounds, aromatic carboxylic acid compounds, and metal compounds.

18. A photosensitive, pressure-sensitive recording medium for forming a visible image using developer material and microcapsules encapsulating a dye precursor color-reactable with the developer material, comprising:
- a support;
- an image-forming layer provided on the support on which a visible image is formed; and
- a separate image-forming layer receiving substrate for receiving and supporting the image-forming layer thereon, the image-forming layer including the developer material capable of color-forming reaction with the dye precursor encapsulated in the microcapsules, and an encapsulated adhesive for transferring and securing the image-forming layer to the separate image-forming layer receiving substrate irrespective of the visible image on the image-forming layer.

19. The recording medium as claimed in claim 18, wherein said adhesive is a pressure-sensitive adhesive.

20. The recording medium as claimed in claim 19, which comprises (i) a sticky sheet having a sticky surface and composed of said support having coated thereon (a) light-sensitive microcapsules encapsulating at least a dye precursor and a photosensitive resin, (b) color developer capable of color-forming reaction with said dye precursor and (c) said pressure-sensitive adhesive, and (ii) a separable sheet provided on the sticky surface of the sticky sheet.

21. The recording medium as claimed in claim 1 which comprises said support having provided thereon light-sensitive microcapsules encapsulating at least a dye precursor and a photosensitive resin, a color developer capable of color-forming reaction with said dye precursor and said adhesive.

22. The recording medium as claimed in claim 18, wherein said adhesive is encapsulated in microcapsules.

23. The recording medium as claimed in claim 1, wherein said color developer is selected from the group consisting of inorganic acidic substance, phenolic compounds, aromatic carboxylic acid compounds, and metal compounds.

24. A recording medium for forming an image, comprising:

a separate image-receiving sheet;
a support having a color developer layer and an adhesive layer provided on said color developer layer, said support adhering to said separate sheet through said adhesive layer; and
a pressure-sensitive, photocurable microcapsule sheet, said microcapsule sheet and said support cooperating to provide an image by transfer to the support of a developed image resulting from a reaction of dye precursor released from ruptured microcapsules and color developer.

25. A photosensitive recording medium for forming a visible image using developer material and microcapsules encapsulating dye precursor color-reactable with the developer material, comprising:
   a support;
   an image-forming layer provided on the support on which a visible image is formed; and
   a separate image-forming layer receiving substrate for receiving and supporting the image-forming layer thereon, the image-forming layer including the developer material capable of color-forming reaction with the dye precursor encapsulated in the microcapsules, and a pressure-sensitive adhesive layer for transferring and securing the image-forming layer to the separate image-forming layer receiving substrate irrespective of formation of the visible image on the image-forming layer, said support having a layer of said color developer on one surface thereof, said color developer layer containing light-sensitive microcapsules encapsulating at least a dye precursor and a photosensitive resin, said adhesive layer and a separable sheet being provided, in sequence, on the opposite surface of the support.

26. A photosensitive recording medium for forming a visible image using developer material and microcapsules encapsulating dye precursor color-reactable with the developer material, comprising:
   a support;
   an image-forming layer provided on the support on which a visible image is formed;
   a separate image-forming layer receiving substrate for receiving and supporting the image-forming layer thereon, the image-forming layer including the developer material capable of color-forming reaction with the dye precursor encapsulated in the microcapsules, and a pressure-sensitive adhesive for transferring and securing the image-forming layer to the separate image-forming layer receiving substrate irrespective of formation of the visible image on the image-forming layer;
   a sticky sheet having a sticky surface and composed of said support having coated thereon (a) light-sensitive microcapsules encapsulating at least a dye precursor and a photosensitive resin, (b) color developer capable of color-forming reaction with said dye precursor and (c) the pressure-sensitive adhesive, in layers and/or in the form of dispersion; and
   a separate sheet provided on the sticky surface of the sticky sheet, the support having coated on one surface thereof the light-sensitive microcapsules and the color developer in layers or in the form of dispersion, and further coated on the opposite surface of the support, in sequence, a layer of the pressure-sensitive adhesive and the separable sheet.

27. A photosensitive recording medium for forming a visible image using developer material and microcapsules encapsulating dye precursor color-reactable with the developer material, comprising:
   a support;
   an image-forming layer provided on the support on which a visible image is formed; and
   a separate image-forming layer receiving substrate for receiving and supporting the image-forming layer thereon, the image-forming layer including the developer material capable of color-forming reaction with the dye precursor encapsulated in the microcapsules, and a heat-sensitive adhesive provided in the form of an outer layer for transferring and securing the image-forming layer to the separate image-forming layer receiving substrate irrespective of formation of the visible image on the image-forming layer, said support having provided thereon light-sensitive microcapsules encapsulating at least a dye precursor and a photosensitive resin, a color developer capable of color-forming reaction with said dye precursor and said adhesive.

28. A photosensitive recording medium for forming a visible image using developer material and microcapsules encapsulating dye precursor color-reactable with the developer material, comprising:
   a support;
   an image-forming layer provided on the support on which a visible image is formed; and
   a separate image-forming layer receiving substrate for receiving and supporting the image-forming layer thereon, the image-forming layer including the developer material capable of color-forming reaction with the dye precursor encapsulated in the microcapsules, and a microcapsule encapsulated adhesive for transferring and securing the image-forming layer to the separate image-forming layer receiving substrate irrespective of formation of the visible image on the image-forming layer, said support having provided thereon light-sensitive microcapsules encapsulating at least a dye precursor and a photosensitive resin, a color developer capable of color-forming reaction with said dye precursor and said microcapsule encapsulated adhesive.

29. A photosensitive recording medium for forming a visible image using developer material and microcapsules encapsulating dye precursor color-reactable with the developer material, comprising:
   a support;
   an image-forming layer provided on the support on which a visible image is formed;
   a separate image-forming layer receiving substrate for receiving and supporting the image-forming layer thereon, the image-forming layer including the developer material capable of color-forming reaction with the dye precursor encapsulated in the microcapsules, and a pressure-sensitive adhesive layer for transferring and securing the image-forming layer to the separate image-forming layer receiving substrate irrespective of formation of the visible image on the image-forming layer, said pressure-sensitive adhesive being a composition comprising an elastic body and a tackifier;
   a sticky sheet having a sticky surface and composed of said support having coated thereon (a) light-sensitive microcapsules encapsulating at least a dye precursor and a photosensitive resin, (b) color developer capable of color-forming reaction with said dye precursor and (c) said pressure-sensitive adhesive layer; and a separable sheet provided on the sticky surface of the sticky sheet, said support having coated on one surface thereof the light-sensitive microcapsules and the color developer in layers or in the form of dispersion, and further coated on the opposite surface of the support, in sequence, the pressure-sensitive adhesive layer and the separable sheet.

30. A photosensitive recording medium for forming a visible image using developer material and microcapsules encapsulating dye precursor color-reactable with the developer material, comprising:

a support;

an image-forming layer provided on the support on which a visible image is formed; and a separate image-forming layer receiving substrate for receiving and supporting the image-forming layer thereon, the image-forming layer including the developer material capable of color-forming reaction with the dye precursor encapsulated in the microcapsules, and a heat-sensitive adhesive for transferring and securing the image-forming layer to the separate image-forming layer receiving substrate irrespective of formation of the visible image on the image-forming layer, said support having provided thereon light-sensitive microcapsules encapsulating at least a dye precursor and a photosensitive resin, color developer capable of color-forming reaction with said dye precursor and said adhesive being provided as an outer layer, said heat-sensitive adhesive being a thermoplastic substance selected from the group consisting of vinyl resins, acrylic resins, styrene resins, cumarone-indene resins, polyamide resins and waxes.

* * * * *

UNITED STATES PATENT AND TRADEMARK OFFICE
CERTIFICATE OF CORRECTION

PATENT NO. : 5,043,314

DATED : AUGUST 27, 1991

INVENTOR(S) : KOJI SUZUKI, JUN SAKAI, SHUNICHI HIGASHIYAMA, KEIKO SUZUKI and MIKIO IMAEDA It is certified that error appears in the above-identified patent and that said Letters Patent is hereby corrected as shown below:

ON THE COVER PAGE:

In the section "Related U.S. Application Data"

line [63], change "284,096," to --184,096--.

Signed and Sealed this

Second Day of March, 1993

*Attest:*

STEPHEN G. KUNIN

*Attesting Officer*      *Acting Commissioner of Patents and Trademarks*